(12) United States Patent
Chen et al.

(10) Patent No.: US 11,270,649 B2
(45) Date of Patent: Mar. 8, 2022

(54) SHIFT REGISTER, DRIVING METHOD THEREOF, DRIVING CIRCUIT, AND DISPLAY DEVICE

(71) Applicants: Hefei Boe Display Technology Co. LTD., Anhui (CN); Boe Technology Group Co., Ltd., Beijing (CN)

(72) Inventors: Mo Chen, Beijing (CN); Fei Han, Beijing (CN); Chao Kong, Beijing (CN); Boxuan Xing, Beijing (CN); Siying Lu, Beijing (CN)

(73) Assignees: Hefei Boe Display Technology Co. Ltd., Anhui (CN); Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/826,039

(22) Filed: Mar. 20, 2020

(65) Prior Publication Data
US 2021/0118373 A1    Apr. 22, 2021

(30) Foreign Application Priority Data
Oct. 21, 2019   (CN) .......................... 201911000966.4

(51) Int. Cl.
*G09G 3/30*      (2006.01)
*G09G 3/36*      (2006.01)
*G09G 3/3266*    (2016.01)

(52) U.S. Cl.
CPC .......... *G09G 3/3266* (2013.01); *G09G 3/3677* (2013.01); *G09G 2310/0286* (2013.01); *G09G 2310/08* (2013.01)

(58) Field of Classification Search
CPC .. G09G 2310/02–0297; G09G 2310/062–067; G09G 2310/08; G09G 2300/0838; G09G 2300/0871; G09G 2300/0219; G09G 1/143; G09G 3/30; G09G 3/0291; G09G 3/0266; G09G 3/3611; G09G 3/3696
See application file for complete search history.

(56) References Cited

U.S. PATENT DOCUMENTS

2016/0365054 A1* 12/2016  Wu ..................... G09G 3/3677
2017/0061922 A1*  3/2017  Wang .................. G11C 19/188
2017/0092172 A1*  3/2017  Wang .................... G11C 19/00

* cited by examiner

*Primary Examiner* — Sanghyuk Park
(74) *Attorney, Agent, or Firm* — Arent Fox LLP; Michael Fainberg (57) ABSTRACT

The present disclosure discloses a shift register, a driving method thereof, a driving circuit, and a display device. The shift register includes an input circuit, a first control circuit, a second control circuit, and an output circuit. Signal shift output can be implemented through mutual cooperation between respective circuits. An output signal can be used as a light emitting control signal of a light emitting control transistor, or can be used as a gate scanning signal of a scanning control transistor.

16 Claims, 7 Drawing Sheets

SHIFT REGISTER, DRIVING METHOD THEREOF, DRIVING CIRCUIT, AND DISPLAY DEVICE

This application claims priority to Chinese Patent Application No. 201911000966.4, filed on Oct. 21, 2019, which is hereby incorporated by reference in its entirety.

FIELD

The present disclosure relates to the field of display technologies, and in particular, to a shift register, a driving method thereof, a driving circuit, and a display device.

BACKGROUND

With rapid development of display technologies, display panels are increasingly moving towards high integration and low cost, where a gate driver on array (GOA) technology integrates a thin film transistor (TFT) gate switch circuit on an array substrate of a display panel to form scanning driving for a display panel, so that a wiring space in a bonding (Bonding) area and a fan-out (Fan-out) area of the gate integrated circuit (IC) can be eliminated, further not only can product costs in materials and manufacturing process be reduced, but also the display panel can be beautifully designed with bilaterally symmetry and narrow bezels. In addition, a bonding process in a gate scanning line direction can further be omitted in such integration process, so that productivity and yield are improved.

SUMMARY

Embodiments of the present disclosure provide a shift register, a driving method thereof, a driving circuit, and a display device to implement signal shift output.

Therefore, an embodiment of the present disclosure provides a shift register, including: an input circuit, a first control circuit, a second control circuit, and an output circuit.

The input circuit is configured to provide a signal of an input signal end for a first node under control of a signal of a first clock signal end.

The first control circuit is configured to control a signal of a second node according to the signal of the first clock signal end, a signal of a second clock signal end, a signal of a third clock signal end, and the signal of the first node.

The second control circuit is configured to provide a signal of a fourth clock signal end for a third node under control of the signal of the second node, and provide a signal of a first reference signal end for the third node under control of the signal of the first node.

The output circuit is configured to provide the signal of the first reference signal end for an output signal end under control of a signal of the third node, and provide a signal of a second reference signal end for the output signal end under control of the signal of the first node.

Optionally, the input circuit includes a first switch transistor, where a first end of the first switch transistor is electrically connected to the input signal end, and a control end of the first switch transistor is electrically connected to the first clock signal end, and a second end of the first switch transistor is electrically connected to the first node.

Optionally, the first control circuit includes a second switch transistor, a third switch transistor, a fourth switch transistor, and a fifth switch transistor.

A first end of the second switch transistor is electrically connected to the first clock signal end, a control end of the second switch transistor is electrically connected to the first clock signal end, and a second end of the second switch transistor is electrically connected to the second node.

A first end of the third switch transistor is electrically connected to the first reference signal end, a control end of the third switch transistor is electrically connected to the third clock signal end, and a second end of the third switch transistor is electrically connected to the second node.

A first end of the fourth switch transistor is electrically connected to the second node, a control end of the fourth switch transistor is electrically connected to the second clock signal end, and a second end of the fourth switch transistor is connected to a first end of the fifth switch transistor.

A control end of the fifth switch transistor is electrically connected to the first node, and a second end of the fifth switch transistor is electrically connected to the first reference signal end.

Optionally, the second control circuit includes a first capacitor, a sixth switch transistor, and a seventh switch transistor.

A first end of the first capacitor is electrically connected to the second node, and a second end of the first capacitor is electrically connected to the third node.

A first end of the sixth switch transistor is electrically connected to the fourth clock signal end, a control end of the sixth switch transistor is electrically connected to the second node, and a second end of the sixth switch transistor is electrically connected to the third node.

A first end of the seventh switch transistor is electrically connected to the third node, a control end of the seventh switch transistor is electrically connected to the first node, and a second end of the seventh switch transistor is electrically connected to the first reference signal end.

Optionally, the output circuit includes a second capacitor, an eighth switch transistor, and a ninth switch transistor.

A first end of the second capacitor is electrically connected to the third node, and a second end of the second capacitor is electrically connected to the output signal end.

A first end of the eighth switch transistor is electrically connected to the first reference signal end, a control end of the eighth switch transistor is electrically connected to the third node, and a second end of the eighth switch transistor is electrically connected to the output signal end.

A first end of the ninth switch transistor is electrically connected to the output signal end, a control end of the ninth switch transistor is electrically connected to the first node, and a second end of the ninth switch transistor is electrically connected to the second reference signal end.

Optionally, the shift register further includes a capacitive coupling circuit configured to adjust the signal of the first node according to the signal of the second clock signal end.

Optionally, the capacitive coupling circuit includes a third capacitor and a tenth switch transistor, where a first end of the third capacitor is electrically connected to the first node, and a second end of the third capacitor is electrically connected to a first end of the tenth switch transistor; and a control end of the tenth switch transistor is electrically connected to the first node, and a second end of the tenth switch transistor is electrically connected to the second clock signal end.

Correspondingly, an embodiment of the present disclosure further provides a driving circuit, including cascaded a plurality of the above shift registers.

Correspondingly, an embodiment of the present disclosure further provides a display device, including the above driving circuit.

Correspondingly, an embodiment of the present disclosure further provides a method for driving the above shift register, including the following stages.

At a first stage, loading a first signal for the first clock signal end, loading a second signal for the second clock signal end, the third clock signal end, and the fourth clock signal end, and loading the second signal for the input signal end, where a level of the first signal is a first level, and a level of the second signal is a second level.

At a second stage, loading the first signal for the second clock signal end, loading the second signal for the first clock signal end, the third clock signal end, and the fourth clock signal end, and loading the second signal for the input signal end.

At a third stage, loading the first signal for the fourth clock signal end, loading the second signal for the first clock signal end, the second clock signal end, and the third clock signal end, and loading the first signal for the input signal end.

at a fourth stage, loading the first signal for the third clock signal end, loading the second signal for the first clock signal end, the second clock signal end, and the fourth clock signal end, and loading the first signal for the input signal end.

At a fifth stage, loading the first signal for the first clock signal end, loading the second signal for the second clock signal end, the third clock signal end, and the fourth clock signal end, and loading the first signal for the input signal end.

DETAILED DESCRIPTION OF THE EMBODIMENTS

To make objectives, technical solutions, and advantages of the embodiments of the present disclosure clearer, the technical solutions of the embodiments of the present disclosure are clearly and completely described below in combination with accompanying drawings of the embodiments of the present disclosure. Obviously, the described embodiments are a part of embodiments of the present disclosure, but not all the embodiments. In a case of no confliction, the embodiments of the present disclosure and features in the embodiments can be combined with each other. Based on the described embodiments of the present disclosure, all other embodiments obtained by ordinary those skilled in the art without creative efforts shall fall within the protection scope of the present disclosure.

Unless otherwise defined, the technical or scientific terms used herein shall have the ordinary meanings understood by ordinary those skilled in the field to which the present disclosure belongs. The words such as "first" and "second" used in the present disclosure do not indicate any order, quantity, or importance, but are only used to distinguish different components. The word such as "comprise" or "include" means that elements or items appearing before the word covers elements or items appearing after the word and the equivalents thereof without excluding other elements or items. Words such as "connected" or "electrically connected" are not limited to physical or mechanical connections, but may include electrical connection, whether direct or indirect.

It should be noted that sizes and shapes of the figures in the accompanying drawings do not reflect the true scale, and the objective is only to illustrate the present disclosure. The same or similar reference numerals indicate the same or similar elements or elements having the same or similar functions throughout.

Figure 1:
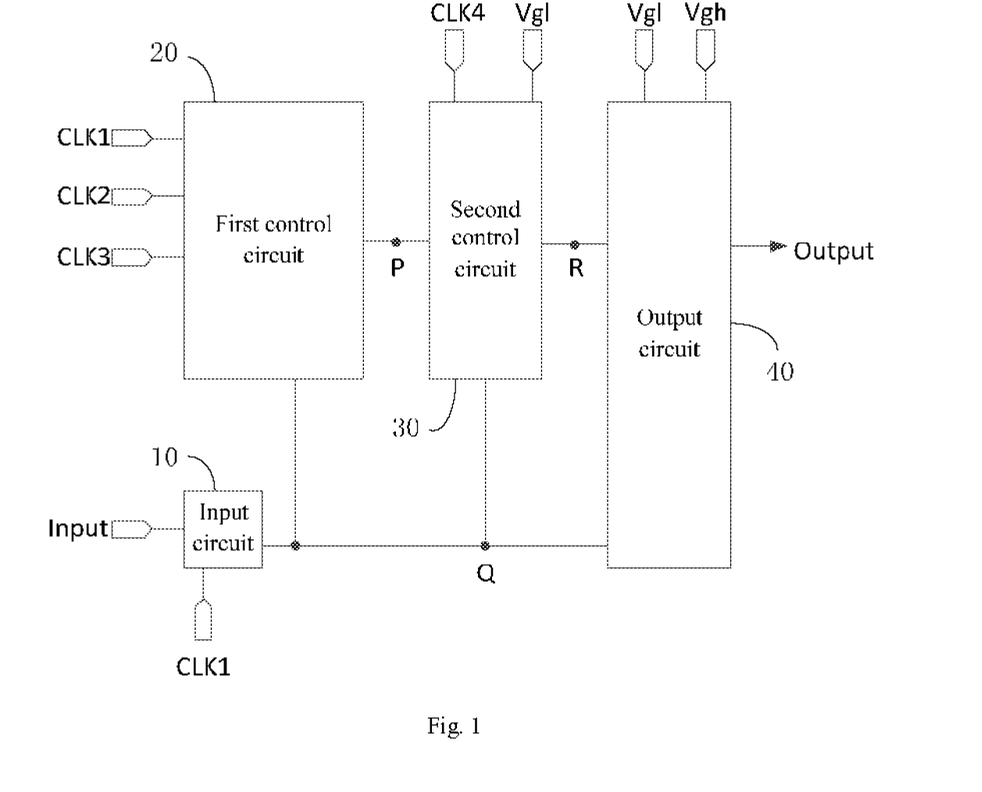
FIG. 1 is a structural schematic diagram of a shift register according to an embodiment of the present disclosure.

As shown in FIG. 1, an embodiment of the present disclosure provides a shift register. The shift register includes an input circuit 10, a first control circuit 20, a second control circuit 30, and an output circuit 40.

The input circuit 10 is configured to provide a signal of an input signal end Input for a first node Q under control of a signal of a first clock signal end CLK1.

The first control circuit 20 is configured to control a signal of a second node P according to the signal of the first clock signal end CLK1, a signal of a second clock signal end CLK2, a signal of a third clock signal end CLK3, and a signal of the first node Q.

The second control circuit 30 is configured to provide a signal of a fourth clock signal end CLK4 for a third node R under control of the signal of the second node P, and provide a signal of a first reference signal end Vgl for the third node R under control of the signal of the first node Q.

The output circuit 40 is configured to provide the signal of the first reference signal end Vgl for an output signal end Output under control of a signal of the third node R, and provide a signal of a second reference signal end Vgh for the output signal end Output under control of the signal of the first node Q.

The shift register provided by the embodiment of the present disclosure can implement signal shift output by using mutual cooperation of the circuits, and an output signal can be used as a light emitting control signal of a light emitting control transistor, or can be used as a gate scanning signal of a scanning control transistor.

Figure 2:
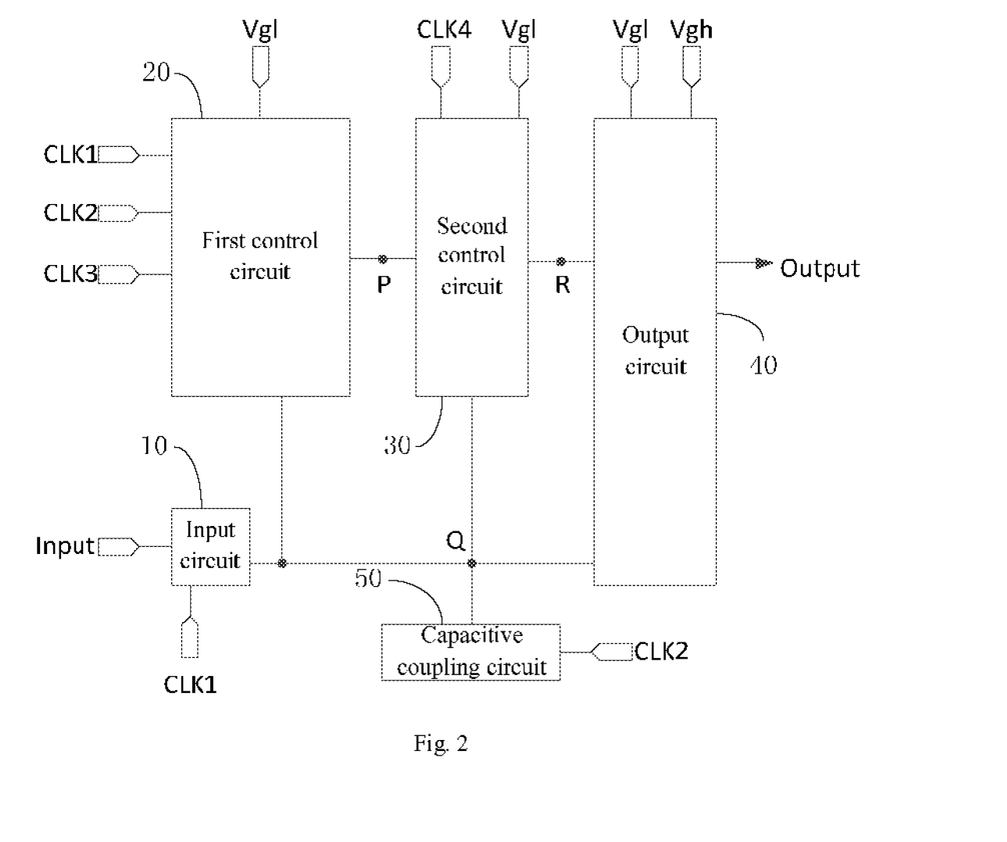
FIG. 2 is a structural schematic diagram of another shift register according to an embodiment of the present disclosure.

In specific implementation, in the shift register provided by the embodiment of the present disclosure, as shown in FIG. 2, the shift register further includes a capacitive coupling circuit 50, and the capacitive coupling circuit 50 is configured to adjust the signal of the first node Q according to the signal of the second clock signal end CLK2. In this way, the signal of the first node Q can be adjusted by the arranged capacitive coupling circuit 50, so that a signal output from the shift register is more stable.

Figure 3:
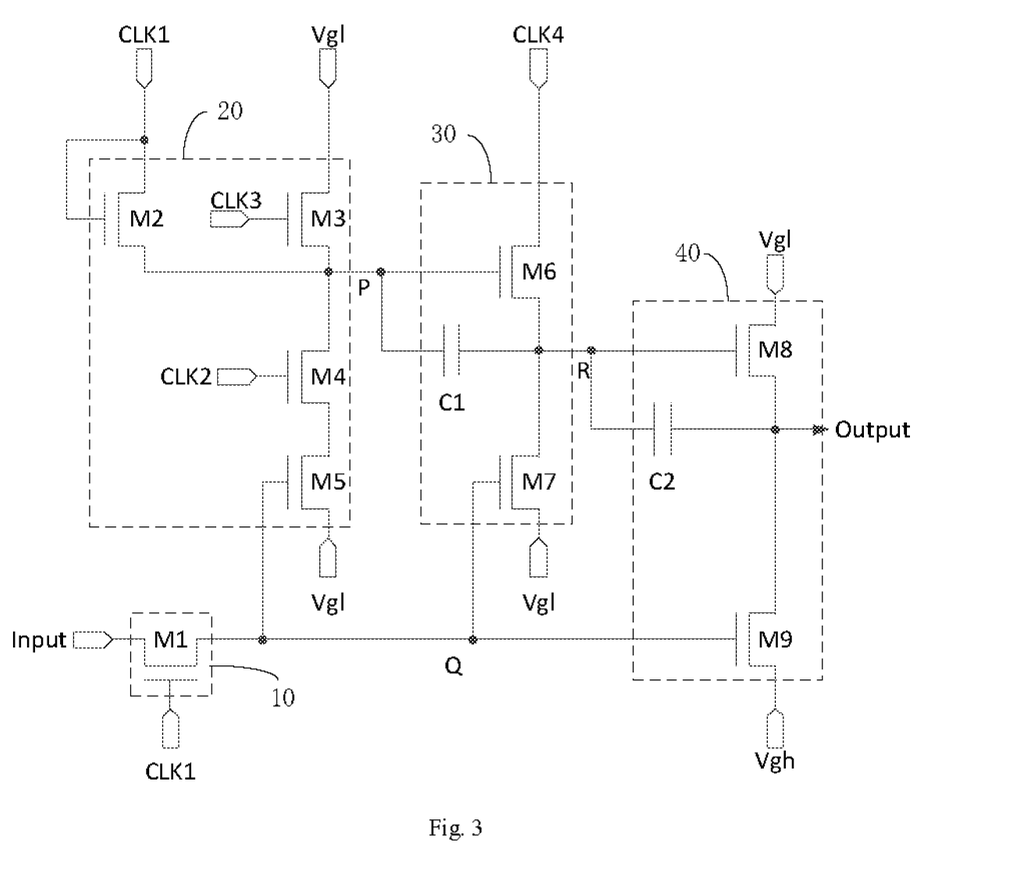
FIG. 3 is a schematic diagram of a specific structure of a shift register according to an embodiment of the present disclosure.
Figure 4:
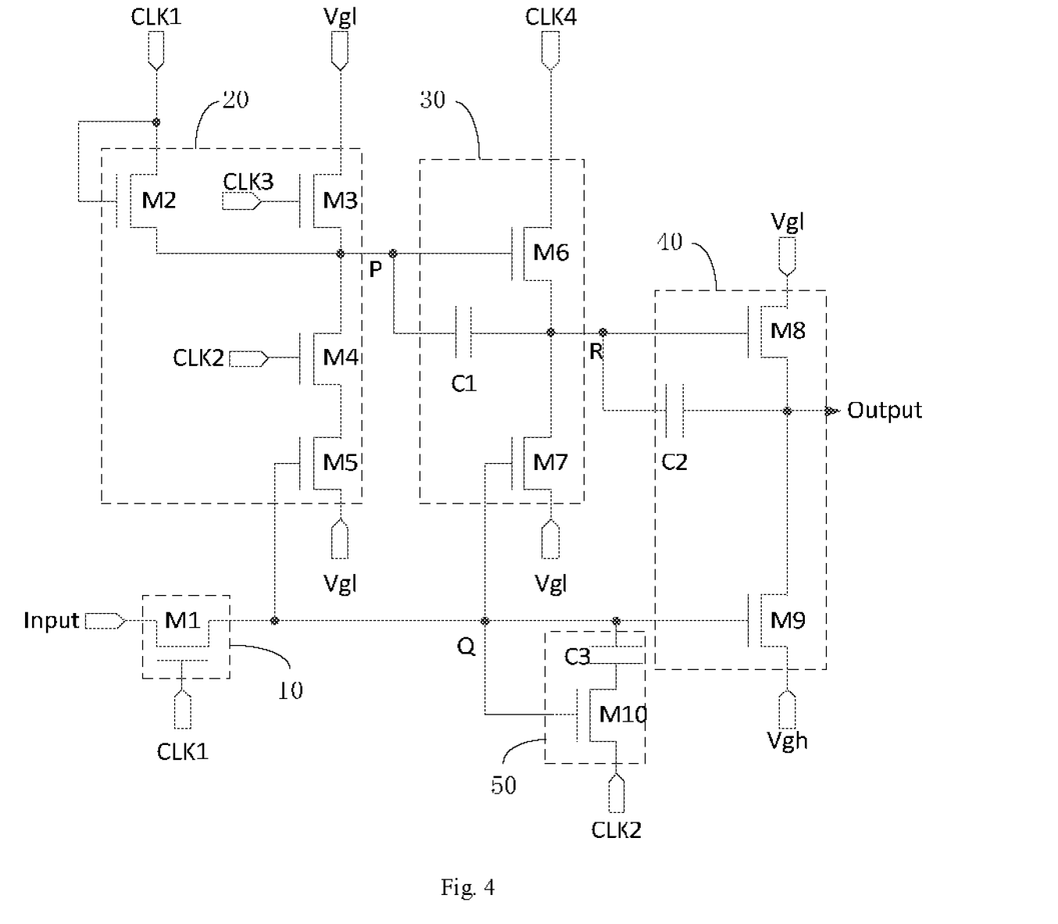
FIG. 4 is a schematic diagram of a specific structure of another shift register according to an embodiment of the present disclosure.

In specific implementation, in the shift register provided by the embodiment of the present disclosure, as shown in FIG. 3 and FIG. 4, the input circuit 10 includes a first switch transistor M1, where a first end of the first switch transistor M1 is electrically connected to the input signal end Input, a control end of the first switch transistor M1 is electrically connected to the first clock signal end CLK1, and a second end of the first switch transistor M1 is electrically connected to the first node Q.

In specific implementation, when the first switch transistor M1 is in a conductive state under control of the first clock signal end CLK1, the signal of the input signal end Input may be provided for the first node Q.

In specific implementation, in the shift register provided by the embodiment of the present disclosure, as shown in FIG. 3 and FIG. 4, the first control circuit 20 includes a second switch transistor M2, a third switch transistor M3, a fourth switch transistor M4, and a fifth switch transistor M5.

A first end of the second switch transistor M2 is electrically connected to the first clock signal end CLK1, a control end of the second switch transistor M2 is electrically connected to the first clock signal end CLK1, and a second end of the second switch transistor M2 is electrically connected to the second node P.

A first end of the third switch transistor M3 is electrically connected to the first reference signal end Vgl, a control end of the third switch transistor M3 is electrically connected to the third clock signal end CLK3, and a second end of the third switch transistor M3 is electrically connected to the second node P.

A first end of the fourth switch transistor M4 is electrically connected to the second node P, a control end of the fourth switch transistor M4 is electrically connected to the second clock signal end CLK2, and a second end of the fourth switch transistor M4 is connected to a first end of the fifth switch transistor M5.

A control end of the fifth switch transistor M5 is electrically connected to the first node Q, and a second end of the fifth switch transistor M5 is electrically connected to the first reference signal end Vgl.

In specific implementation, when the second switch transistor M2 is in a conductive state under control of the first clock signal end CLK1, the signal of the first clock signal end CLK1 may be provided for the second node P.

In specific implementation, when the third switch transistor M3 is in a conductive state under control of the third clock signal end CLK3, the signal of the first reference signal end Vgl may be provided for the second node P.

In specific implementation, when the fourth switch transistor M4 is in a conductive state under control of the second clock signal end CLK2 and the fifth switch transistor M5 is in a conductive state under signal control of the first node Q, the signal of the first reference signal end Vgl is provided for the second node P.

In specific implementation, in the shift register provided by the embodiment of the present disclosure, as shown in FIG. 3 and FIG. 4, the second control circuit 30 includes a first capacitor C1, a sixth switch transistor M6, and a seventh switch transistor M7.

A first end of the first capacitor C1 is electrically connected to the second node P, and a second end of the first capacitor C1 is electrically connected to the third node R.

A first end of the sixth switch transistor M6 is electrically connected to the fourth clock signal end CLK4, a control end of the sixth switch transistor M6 is electrically connected to the second node P, and a second end of the sixth switch transistor M6 is electrically connected to the third node R.

A first end of the seventh switch transistor M7 is electrically connected to the third node R, a control end of the seventh switch transistor M7 is electrically connected to the first node Q, and a second end of the seventh switch transistor M7 is electrically connected to the first reference signal end Vgl.

In specific implementation, when the sixth switch transistor M6 is in a conductive state under signal control of the second node P, the signal of the third clock signal end CLK3 may be provided for the third node R.

In specific implementation, when the seventh switch transistor M7 is in a conductive state under signal control of the first node Q, the signal of the first reference signal end Vgl may be provided for the third node R.

In specific implementation, the first capacitor C1 is used to keep voltage differences at two ends of the first capacitor stable. Specifically, when the second node P is in a floating state, a voltage difference between the second node P and the control end of the sixth switch transistor M6 is kept stable, and when the third node R is in a floating state, a voltage difference between the third node R and the second end of the sixth switch transistor M6 is kept stable.

In specific implementation, in the shift register provided by the embodiment of the present disclosure, as shown in FIG. 3 and FIG. 4, the output circuit 40 includes a second capacitor C2, an eighth switch transistor M8, and a ninth switch transistor M9.

A first end of the second capacitor C2 is electrically connected to the third node R, and a second end of the second capacitor C2 is electrically connected to the output signal end Output.

A first end of the eighth switch transistor M8 is electrically connected to the first reference signal end Vgl, a control end of the eighth switch transistor M8 is electrically connected to the third node R, and a second end of the eighth switch transistor M8 is electrically connected to the output signal end Output.

A first end of the ninth switch transistor M9 is electrically connected to the output signal end Output, a control end of the ninth switch transistor M9 is electrically connected to the first node Q, and a second end of the ninth switch transistor M9 is electrically connected to the second reference signal end Vgh.

In specific implementation, when the eighth switch transistor M8 is in a conductive state under signal control of the third node R, the signal of the first reference signal end Vgl may be provided for the output signal end Output.

In specific implementation, when the ninth switch transistor M9 is in a conductive state under signal control of the first node Q, the signal of the second reference signal end Vgh may be provided for the output signal end Output.

In specific implementation, the second capacitor C2 is used to keep voltage differences at two ends of the second capacitor stable. Specifically, when the third node R is in a floating state, a voltage difference between the third node R and the control end of the eighth switch transistor M8 is kept stable, and when the second end of the second capacitor C2 is in a floating state, a voltage difference between the second end of the second capacitor C2 and the output signal end Output is kept stable.

In specific implementation, in the shift register provided by the embodiment of the present disclosure, as shown in FIG. 4, the capacitive coupling circuit 50 includes a third capacitor C3 and a tenth switch transistor M10.

A first end of the third capacitor C3 is electrically connected to the first node Q, and a second end of the third capacitor C3 is electrically connected to a first end of the tenth switch transistor M10.

A control end of the tenth switch transistor M10 is electrically connected to the first node Q, and a second end of the tenth switch transistor M10 is electrically connected to the second clock signal end CLK2.

In specific implementation, when the tenth switch transistor M10 is in a conductive state under signal control of the first node Q, the signal of the second clock signal end CLK2 may be provided for the second end of the third capacitor C3.

In specific implementation, the third capacitor C3 adjusts the signal of the first node Q according to the change of the signal of the second clock signal end CLK2.

The specific structures of the circuits in the shift register provided by the embodiment of the present disclosure are illustrated above by using examples. In specific implementation, the specific structures of the circuits are not limited to the above structures provided by the embodiment of the present disclosure, and may also be other structures known by those skilled in the art, which is not limited herein.

Specifically, to make the manufacturing process uniform, in the shift register provided by the embodiment of the present disclosure, as shown in FIG. 3 and FIG. 4, the switch transistors are N-type transistors, and certainly, the switch transistors may be P-type transistors, which are not limited herein.

Specifically, in the shift register provided by the embodiment of the present disclosure, the P-type transistors are conducted under the action of a low-level signal and are cut off under the action of a high-level signal; and the N-type transistors are conducted under the action of a high-level signal, and are cut off under the action of a low-level signal.

Specifically, in the shift register provided by the embodiment of the present disclosure, the above switch transistors may be thin film transistors (TFT) or metal oxide semiconductor (MOS) field effect transistors, which are not limited herein. In addition, based on different types of the above switch transistors, and different signals of the control ends of the switch transistors, the control ends of the switch transistors are used as gates, the first ends of the switch transistors may be used as sources, and the second ends of the switch transistors may be used as drains; or the first ends of the switch transistors may be used as the drains and the second ends of the switch transistors may be used as the sources, which are not specifically distinguished herein.

The present disclosure is described in detail below in combination with specific embodiments. It should be noted that the embodiments are used to better explain the present disclosure, but not to limit the present disclosure.

A working process of the shift register provided by the embodiment of the present disclosure is described below in combination with a circuit timing diagram. In the following description, a high level is indicated by 1, and a low level is indicated by 0. It should be noted that 1 and 0 are logic levels, are used only for better explaining the specific working process of the embodiments of the present disclosure, and are not specific voltage values.

Embodiment 1

Figure 5:
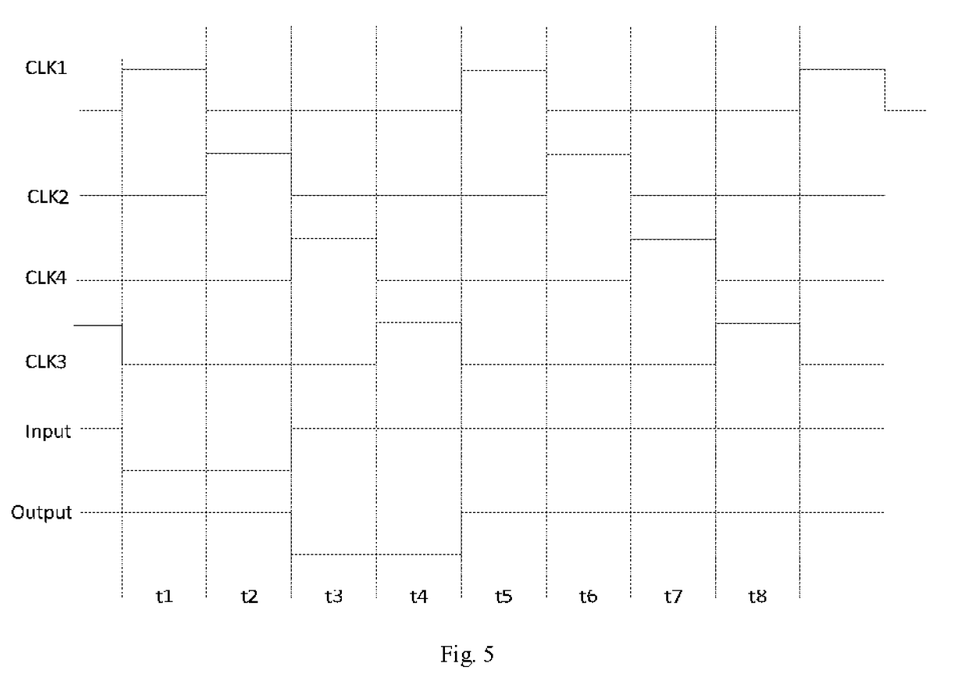
FIG. 5 is an input-output timing diagram according to an embodiment of the present disclosure.

By using a structure of the shift register shown in FIG. 3 as an example, a working process of the above shift register provided by the embodiment of the present disclosure is described below in combination with an input-output timing diagram shown in FIG. 5. The signal of the first reference signal end Vgl is a low-level signal, and the signal of the second reference signal end Vgh is a high-level signal. Specifically, eight stages: a first stage t1, a second stage t2, a third stage t3, a fourth stage t4, a fifth stage t5, a sixth stage t6, a seventh stage t7, and an eighth stage t8 in the input-output timing diagram shown in FIG. 5 are selected. After the eighth stage t8, the working process of the shift register repeats the working process from the fifth stage t5 to the eighth stage t8.

At the first stage t1, Input=0, CLK1=1, CLK2=0, CLK3=0, and CLK4=0.

Due to CLK1=1, the first switch transistor M1 is conducted, and the second switch transistor M2 is conducted. Due to CLK2=0, the fourth switch transistor M4 is cut off. Due to CLK3=0, the third switch transistor M3 is cut off.

Due to CLK1=1, the second switch transistor M2 is conducted, and a high-level signal of the first clock signal end CLK1 is provided for the second node P, so that a level of the second node P is a high level. The sixth switch transistor M6 is conducted, a low-level signal of the fourth clock signal end CLK4 is provided for the third node R, so that a level of the third node R is a low level, and the eighth switch transistor M8 is cut off. Due to CLK1=1, the first switch transistor M1 is conducted, and a low-level signal of the input signal end Input is provided for the first node Q, so that a level of the first node Q is a low level, and the fifth switch transistor M5, the seventh switch transistor M7 and the ninth switch transistor M9 are cut off. The second end of the second capacitor C2 still stores a high-level signal, so that the output signal end Output maintains high-level signal output of the previous stage.

In the second stage t2, Input=0, CLK1=0, CLK2=1, CLK3=0, and CLK4=0.

Due to CLK1=0, the first switch transistor M1 is cut off, and the second switch transistor M2 is cut off. Due to CLK2=1, the fourth switch transistor M4 is conducted. Due to CLK3=0, the third switch transistor M3 is cut off.

Due to a bootstrapping effect of the first capacitor C1, the level of the second node P is maintained to be the high level. The sixth switch transistor M6 is conducted, and the low-level signal of the fourth clock signal end CLK4 is provided for the third node R, so that the level of the third node R is the low level, and the eighth switch transistor M8 is cut off. Due to CLK1=0, the first switch transistor M1 is cut off, the level of the first node Q is maintained to be the low level, and the fifth switch transistor M5, the seventh switch transistor M7, and the ninth switch transistor M9 are cut off. The second end of the second capacitor C2 still stores the high-level signal, so that the output signal end Output maintains high-level signal output of the previous stage.

At the third stage t3, Input=1, CLK1=0, CLK2=0, CLK3=0, and CLK4=1.

Due to CLK1=0, the first switch transistor M1 is cut off, and the second switch transistor M2 is cut off. Due to CLK2=0, the fourth switch transistor M4 is cut off. Due to CLK3=0, the third switch transistor M3 is cut off.

The level of the first node Q is maintained to be the low level, and the fifth switch transistor M5, the seventh switch transistor M7, and the ninth switch transistor M9 are cut off. The level of the second node P is maintained to be the high level, the sixth switch transistor M6 is conducted, and the high-level signal of the fourth clock signal end CLK4 is provided for the third node R, so that the level of the third node R is a high level, and the eighth switch transistor M8 is conducted. The level of the third node R is the high level, and according to the bootstrapping effect of the first capacitor C1, the level of the second node P is further pulled up, so that the sixth switch transistor M6 is completely conducted as much as possible, the high-level signal of the clock signal end CLK4 is provided for the third node R without voltage loss as much as possible, and the eighth switch transistor M8 is completely conducted as much as possible. Therefore, a low-level signal of the first reference signal end Vgl can be provided for the output signal end Output without voltage loss as much as possible. The low-level signal of the first reference signal end Vgl is provided for the output signal end Output, so that the output signal end Output outputs the low-level signal.

At the fourth stage t4, Input=1, CLK1=0, CLK2=0, CLK3=1, and CLK4=0. Due to CLK=0, the first switch transistor M1 is cut off, and the second switch transistor M2 is cut off. Due to CLK2=0, the fourth switch transistor M4 is cut off. Due to CLK3=1, the third switch transistor M3 is conducted.

The level of the first node Q is maintained to be the low level, the fifth switch transistor M5, the seventh switch transistor M7, and the ninth switch transistor M9 are cut off. Due to CLK3=1, the third switch transistor M3 is conducted, and the low-level signal of the first reference signal end Vgl is provided for the second node P, so that the level of the second node P is a low level, and the sixth switch transistor M6 is cut off. Due to a bootstrapping effect of the second capacitor C2, the level of the third node R is maintained to be the high level, and the eighth switch transistor M8 is conducted. The low-level signal of the first reference signal end Vgl is provided for the output signal end Output, so that the output signal end Output outputs the low-level signal.

At the fifth stage t5, Input=1, CLK1=1, CLK2=0, CLK3=0, and CLK4=0.

Due to CLK1=1, the first switch transistor M1 is conducted, and the second switch transistor M2 is conducted. Due to CLK2=0, the fourth switch transistor M4 is cut off. Due to CLK3=0, the third switch transistor M3 is cut off.

Due to CLK1=1, the second switch transistor M2 is conducted, and the high-level signal of the first clock signal end CLK1 is provided for the second node P, so that the level of the second node P is a high level. The sixth switch transistor M6 is conducted, the low-level signal of the fourth clock signal end CLK4 is provided for the third node R, so that the level of the third node R is a low level, and the eighth switch transistor M8 is cut off. Due to CLK1=1, the first switch transistor M1 is conducted, and the high-level signal of the input signal end Input is provided for the first node Q, so that the level of the first node Q is a high level, and the fifth switch transistor M5, the seventh switch transistor M7, and the ninth switch transistor M9 are conducted. The seventh switch transistor M7 is conducted, and the low-level signal of the first reference signal end Vgl is provided for the third node R, so that the level of the third node R is further a low level, and the eighth switch transistor M8 is cut off. The ninth switch transistor M9 is conducted, and a high-level signal of the second reference signal end Vgh is provided for the output signal end Output, so that the output signal end Output outputs the high-level signal. In addition, the high-level signal of the second reference signal end Vgh is provided for the second end of the second capacitor C2.

At the sixth stage t6, Input=0, CLK1=0, CLK2=1, CLK3=0, and CLK4=0.

Due to CLK1=0, the first switch transistor M1 is cut off, and the second switch transistor M2 is cut off. Due to CLK2=1, the fourth switch transistor M4 is conducted. Due to CLK3=0, the third switch transistor M3 is cut off.

The level of the first node Q is maintained to be the high level, the fifth switch transistor M5, the seventh switch transistor M7, and the ninth switch transistor M9 are conducted. The fourth switch transistor M4 and the fifth switch transistor M5 are conducted, and the low-level signal of the first reference signal end Vgl is provided for the second node P, so that the level of the second node P is a low level, and the sixth switch transistor M6 is cut off. The seventh switch transistor M7 is conducted, the low-level signal of the first reference signal end Vgl is provided for the third node R, so that the level of the third node R is a low level, and the eighth switch transistor M8 is cut off. The ninth switch transistor M9 is conducted, and the high-level signal of the second reference signal end Vgh is provided for the output signal end Output, so that the output signal end Output outputs the high-level signal.

At the seventh stage t7, Input=1, CLK1=0, CLK2=0, CLK3=0, and CLK4=1.

Due to CLK1=0, the first switch transistor M1 is cut off, and the second switch transistor M2 is cut off. Due to CLK2=0, the fourth switch transistor M4 is cut off. Due to CLK3=0, the third switch transistor M3 is cut off.

The level of the first node Q is maintained to be the high level, and the fifth switch transistor M5, the seventh switch transistor M7, and the ninth switch transistor M9 are conducted. The level of the second node P is maintained to be the low level, the sixth switch transistor M6 is cut off. The seventh switch transistor M7 is conducted, and the low-level signal of the first reference signal end Vgl is provided for the third node R, so that the level of the third node R is a low level, and the eighth switch transistor M8 is cut off. The ninth switch transistor M9 is conducted, and the high-level signal of the second reference signal end Vgh is provided for the output signal end Output, so that the output signal end Output outputs the high-level signal.

At the eighth stage t8, Input=1, CLK1=0, CLK2=0, CLK3=1, and CLK4=0.

Due to CLK1=0, the first switch transistor M1 is cut off, and the second switch transistor M2 is cut off. Due to CLK2=0, the fourth switch transistor M4 is cut off. Due to CLK3=1, the third switch transistor M3 is conducted.

The level of the first node Q is maintained to be the high level, the fifth switch transistor M5, the seventh switch transistor M7, and the ninth switch transistor M9 are conducted. The third switch transistor M3 is conducted, and the low-level signal of the first reference signal end Vgl is provided for the second node P, so that the level of the second node P is a low level, and the sixth switch transistor M6 is cut off. The level of the third node R is maintained to be the low level, the eighth switch transistor M8 is cut off. The ninth switch transistor M9 is conducted, and the high-level signal of the second reference signal end Vgh is provided for the output signal end Output, so that the output signal end Output outputs the high-level signal.

Embodiment 2

By using a structure of the shift register shown in FIG. 4 as an example, a working process of the above shift register provided by the embodiment of the present disclosure is described below in combination with an input-output timing diagram shown in FIG. 5. The signal of the first reference signal end Vgl is a low-level signal, and the signal of the second reference signal end Vgh is a high-level signal. Specifically, eight stages: a first stage t1, a second stage t2, and a third stage t3, a fourth stage t4, a fifth stage t5, a sixth stage t6, a seventh stage t7, and an eighth stage t8 in the input-output timing diagram shown in FIG. 5 are selected. After the eighth stage t8, the working process of the shift register repeats the working process from the fifth stage t5 to the eighth stage t8.

At the first stage t1, Input=0, CLK1=1, CLK2=0, CLK3=0, and CLK4=0.

Because a level of the first node Q is a low level, the tenth switch transistor M10 is cut off. The second end of the second capacitor C2 still stores a high-level signal, so that the output signal end Output outputs the high-level signal. The rest of the working process at the first stage t1 may be basically the same as the working process of the first stage t1 in Embodiment 1, which is not repeatedly described herein.

At the second stage t2, Input=0, CLK1=0, CLK2=1, CLK3=0, and CLK4=0.

Because the level of the first node Q is maintained to be the low level, the tenth switch transistor M10 is cut off. The second end of the second capacitor C2 still stores the high-level signal, so that the output signal end Output outputs the high-level signal. The rest of the working process at the second stage t2 may be basically the same as the working process of the second stage t2 in Embodiment 1, which is not repeatedly described herein.

At the third stage t3, Input=1, CLK1=0, CLK2=0, CLK3=0, and CLK4=1.

Because the level of the first node Q is maintained to be the low level, the tenth switch transistor M10 is cut off. The low-level signal of the first reference signal end Vgl is provided for the output signal end Output, so that the output signal end Output outputs the low-level signal. The rest of the working process at the third stage t3 may be basically the same as the working process of the second stage t3 in Embodiment 1, which is not repeatedly described herein.

At the fourth stage t4, Input=1, CLK1=0, CLK2=0, CLK3=1, and CLK4=0.

Because the level of the first node Q is maintained to be the low level, the tenth switch transistor M10 is cut off. The low-level signal of the first reference signal end Vgl is provided for the output signal end Output, so that the output signal end Output outputs the low-level signal. The rest of the working process at the fourth stage t4 may be basically the same as the working process of the fourth stage t4 in Embodiment 1, which is not repeatedly described herein.

At the fifth stage t5, Input=1, CLK=1, CLK2=0, CLK3=0, and CLK4=0.

Because the level of the first node Q is a high level, the tenth switch transistor M10 is conducted, and a low-level signal of the second clock signal end CLK2 is provided for the second end of the third capacitor C3. The high-level signal of the second reference signal end Vgh is provided for the output signal end Output, so that the output signal end Output outputs the high-level signal. The rest of the working process at the fifth stage t5 may be basically the same as the working process of the fifth stage t5 in Embodiment 1, which is not repeatedly described herein.

At the sixth stage t6, Input=0, CLK1=0, CLK2=1, CLK3=0, and CLK4=0.

Because the level of the first node Q is maintained to be the high level, the fifth switch transistor M5, the seventh switch transistor M7, and the tenth switch transistor M10 are conducted. The fourth switch transistor M4 and the fifth switch transistor M5 are conducted, and the low-level signal of the first reference signal end Vgl is provided for the second node P, so that the level of the second node P is a low-level signal, and the sixth switch transistor M6 is cut off. The seventh switch transistor M7 is conducted, the low-level signal of the first reference signal end Vgl is provided for the third node R, so that the level of the third node R is a low-level signal, and the eighth switch transistor M8 is cut off. The tenth switch transistor M10 is conducted, and the high-level signal of the second clock signal end CLK2 is provided for the second end of the third capacitor C3, so that the level of the second end of the third capacitor C3 is changed from the low level to a high level. Because the third capacitor C3 keeps voltage differences at two ends of the third capacitor unchanged, the level of the first node Q is further pulled up, to ensure that a signal voltage of the first node Q is higher than a threshold voltage of the ninth switch transistor M9, so that the ninth switch transistor M9 is completely conducted. The high-level signal of the second reference signal end Vgh is provided for the output signal end Output without voltage loss as much as possible, so that the output signal end Output outputs the high-level signal.

At the seventh stage t7, Input=1, CLK1=0, CLK2=0, CLK3=0, and CLK4=1.

Because the level of the first node Q is maintained to be the high level, the tenth switch transistor M10 is conducted The ninth switch transistor M9 is conducted, and the high-level signal of the second reference signal end Vgh is provided for the output signal end Output, so that the output signal end Output outputs the high-level signal. The rest of the working process at the seventh stage t7 may be basically the same as the working process of the seventh stage t7 in Embodiment 1, which is not repeatedly described herein.

At the eighth stage t8, Input=1, CLK1=0, CLK2=0, CLK3=1, and CLK4=0.

Because the level of the first node Q is maintained to be the high level, the tenth switch transistor M10 is conducted. The ninth switch transistor M9 is conducted, and the high-level signal of the second reference signal end Vgh is provided for the output signal end Output, so that the output signal end Output outputs the high-level signal. The rest of the working process at the eighth stage t8 may be basically the same as the working process of the eighth stage t8 in Embodiment 1, which is not repeatedly described herein.

Figure 6:
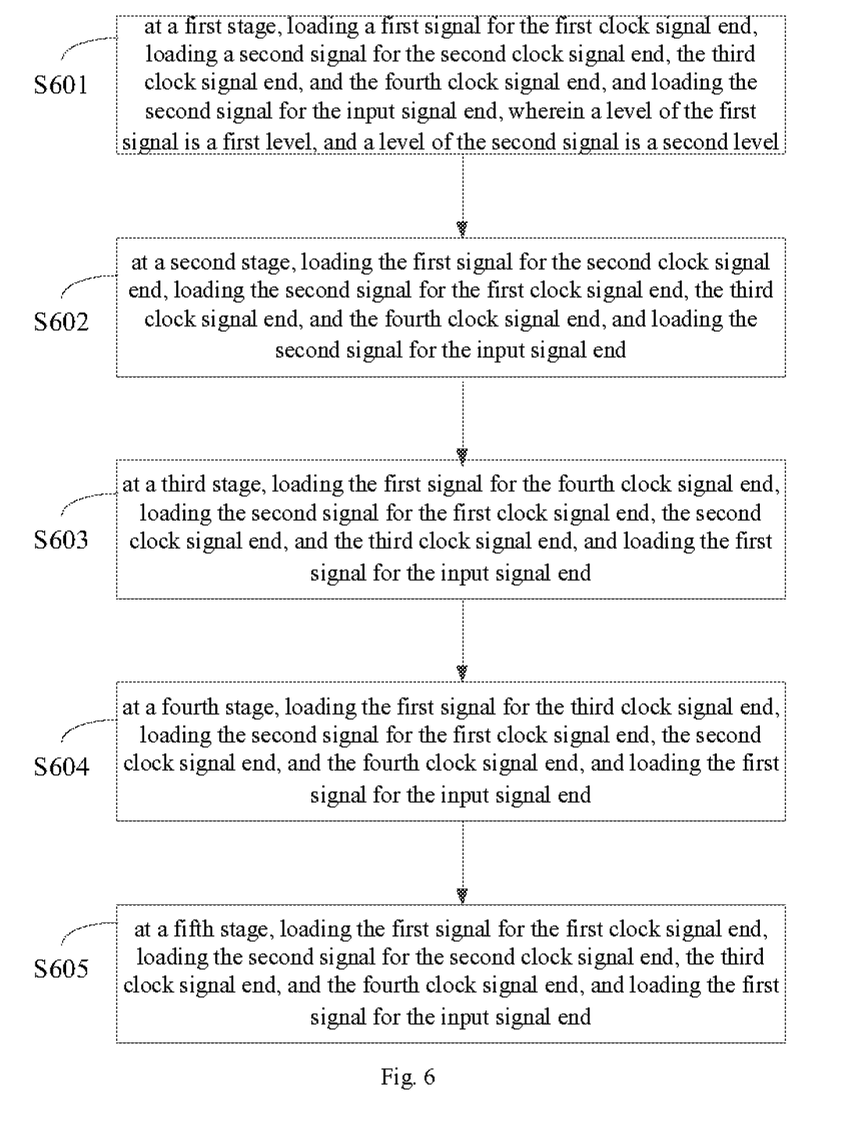
FIG. 6 is a flowchart of a driving method according to an embodiment of the present disclosure.

Based on the same inventive concept, an embodiment of the present disclosure further provides a driving method of any one of the above shift registers provided by the embodiment of the present disclosure, as shown in FIG. 6, including the following stages.

S601. at a first stage, loading a first signal for the first clock signal end, loading a second signal for the second clock signal end, the third clock signal end, and the fourth clock signal end, and loading the second signal for the input signal end, where a level of the first signal is a first level, and a level of the second signal is a second level.

S602. at a second stage, loading the first signal for the second clock signal end, loading the second signal for the first clock signal end, the third clock signal end, and the fourth clock signal end, and loading the second signal for the input signal end.

S603. at a third stage, loading the first signal for the fourth clock signal end, loading the second signal for the first clock signal end, the second clock signal end, and the third clock signal end, and loading the first signal for the input signal end.

S604. at a fourth stage, loading the first signal for the third clock signal end, loading the second signal for the first clock signal end, the second clock signal end, and the fourth clock signal end, and loading the first signal for the input signal end.

S605. at a fifth stage, loading the first signal for the first clock signal end, loading the second signal for the second clock signal end, the third clock signal end, and the fourth clock signal end, and loading the first signal for the input signal end.

In the above driving method provided by the embodiment of the present disclosure, the shift register can output signals stably. In specific implementation, in the above driving method provided by the embodiment of the present disclosure, the first level may be a high level, and correspondingly, the second level is a low level; otherwise, the first level may be a low level, and correspondingly, the second level is a high level, depending on whether the transistors in the shift register are N-type transistors or P-type transistors. Specifically, FIG. 5 shows a circuit timing diagram in which the transistors in the shift register is N-type transistors, the first level is a high level, and the second level is a low level.

Figure 7:
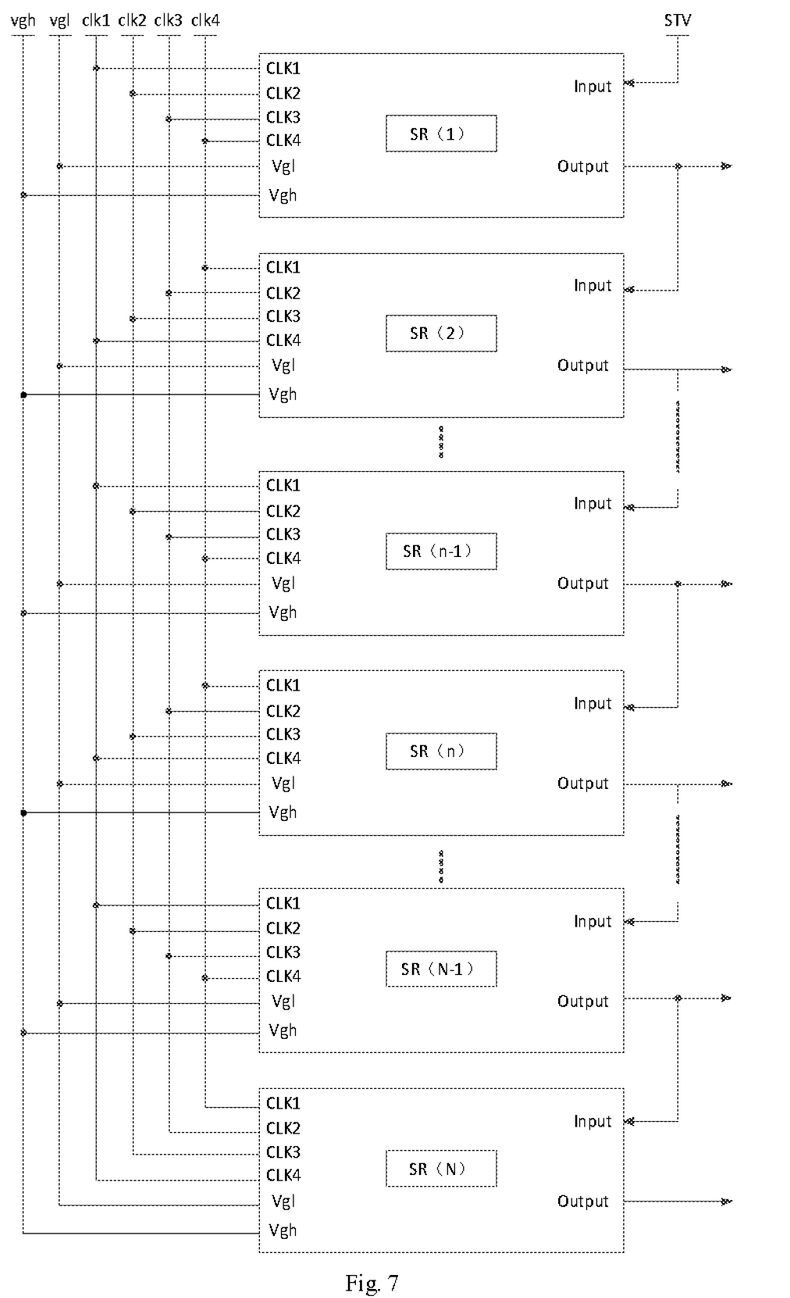
FIG. 7 is a structural schematic diagram of a driving circuit according to an embodiment of the present disclosure.

Based on the same inventive concept, an embodiment of the present disclosure further provides a driving circuit, as shown in FIG. 7, including cascaded a plurality of shift registers provided by any one of the embodiments of the present disclosure: SR(1), SR(2), . . . , SR(n−1), SR(n), . . . , SR(N−1), and SR(N) (N shift registers in total, 1≤n≤N).

An input signal end Input of a first-level shift register SR (1) is electrically connected to a frame trigger signal end STV.

Except the first-level shift register SR (1), an input signal end Input of each level of shift register SR(n) is electrically connected to an output signal end Output of an adjacent previous level of shift register SR(n−1).

Specifically, a specific structure of each shift register in a gate driving circuit is the same in function and structure as any one of the above shift registers provided by the embodiments of the present disclosure. Repeated parts are not described herein.

In specific implementation, in the gate driving circuit provided by the present disclosure, as shown in FIG. 7, a first clock signal end CLK1 of a $(2k-1)^{th}$-level shift register and a fourth clock signal end CLK4 of a $2k^{th}$-level shift register are electrically to the same clock end, i.e., a first clock end clk1. A second clock signal end CLK2 of the $(2k-1)^{th}$-level shift register and a third clock signal end CLK3 of the $2k^{th}$-level shift register are electrically to the same clock end, i.e., a second clock end clk2. A third clock signal end CLK3 of the $(2k-1)^{th}$-level shift register and a second clock signal end CLK2 of the $2k^{th}$-level shift register are electrically to a third clock end clk3. A fourth clock signal end CLK4 of the (2k−1) level shift register and a first clock signal end CLK1 of the $2k^{th}$-level shift register are electrically to a fourth clock end clk4. First reference signal ends Vgl of the various levels of shift registers are electrically connected to the same signal end, i.e., a first reference end vgl, and second reference signal ends Vgh of the various levels of shift registers are electrically connected to the same signal end, i.e., a second reference end vgh, where k is a positive integer.

In specific implementation, the driving circuit provided by the embodiment of the present disclosure can be used as a gate driving circuit for providing a gate scanning signal of a scanning control transistor.

In specific implementation, the driving circuit provided by the embodiment of the present disclosure can be used as a light emitting driving circuit for providing a light emitting control signal of a light emitting control transistor.

Based on the same inventive concept, an embodiment of the present disclosure further provides a display device including the above driving circuit provided by the present disclosure. The specific implementation can refer to an implementation process of the above shift register. The same points are not repeatedly described herein.

In specific implementation, the display device provided by the embodiment of the present disclosure may be an organic light emitting display device, or may be a liquid crystal display device, which is not limited herein.

An organic light emitting display device is generally provided with a plurality of organic light emitting diodes and a pixel circuit connected to the organic light emitting diodes. The pixel circuit is generally provided with a light emitting control transistor for controlling light emission of the organic light emitting diodes and a scanning control transistor for controlling input of a data signal. In specific implementation, when the above display device provided by the embodiment of the present disclosure is an organic light emitting display device, the organic light emitting display device may include the above driving circuit provided by the embodiment of the present disclosure. The driving circuit can be used as a light emitting driving circuit for providing a light emitting control signal of a light emitting control transistor. Alternatively, the driving circuit can be used as a gate driving circuit for providing a gate scanning signal of a scanning control transistor. Certainly, the organic light emitting display device may also include the two driving circuits provided by the embodiment of the present disclosure, where one driving circuit may be used as the light emitting driving circuit for providing the light emitting control signal of the light emitting control transistor, and the other driving circuit is used as the gate driving circuit for providing the gate scanning signal of the scanning control transistor, which is not limited herein.

A liquid crystal display device is generally provided with a plurality of pixel electrodes and switch transistors connected to the pixel electrodes. In specific implementation, when the above display device provided by the embodiment of the present disclosure is a liquid crystal display device, the above driving circuit provided by the embodiment of the present disclosure can be used as a gate driving circuit for providing gate scanning signals of switch transistors.

The display device may be any product or component having a display function, such as a mobile phone, a tablet computer, a television, a display, a notebook computer, a digital photo frame and a navigator. It should be understood by ordinary those skilled in the art that the display device has other essential components, which is not described herein, and should not constitute a limitation on the present disclosure.

A shift register provided by an embodiment of the present disclosure includes: an input circuit, a first control circuit, a second control circuit, and an output circuit, where signal shift output can be implemented through mutual cooperation of the circuits, and an output signal can be used as a light emitting control signal of a light emitting control transistor, or can be used as a gate scanning signal of a scanning control transistor. A driving circuit provided by an embodiment of the present disclosure includes the above shift register, where the above driving circuit is integrated on a display panel to provide a scanning driving signal or a light emitting driving signal for the display panel. In this way, the display panel can be beautifully designed with bilaterally symmetry and narrow border, and a Bonding process in a gate scanning line direction can be omitted, so that productivity and yield are improved.

Obviously, those skilled in the art can make various modifications and variations to the present disclosure without departing from the spirit and scope of the present disclosure. In this way, if these modifications and variations of the present disclosure fall within the scope of claims of the present disclosure and equivalent technologies thereof, the present disclosure also intends to include these modifications and variations.

The invention claimed is:

1. A shift register, comprising:
   an input circuit, configured to provide a signal of an input signal end for a first node under control of a signal of a first clock signal end;

a first control circuit, configured to control a signal of a second node according to the signal of the first clock signal end, a signal of a second clock signal end, a signal of a third clock signal end, and a signal of the first node;

a second control circuit, configured to provide a signal of a fourth clock signal end for a third node under control of the signal of the second node, and provide a signal of a first reference signal end for the third node under control of the signal of the first node; and an output circuit, configured to provide the signal of the first reference signal end for an output signal end under control of a signal of the third node, and provide a signal of a second reference signal end for the output signal end under control of the signal of the first node.

2. The shift register according to claim 1, wherein the input circuit comprises a first switch transistor, a first end of the first switch transistor is electrically connected to the input signal end, and a control end of the first switch transistor is electrically connected to the first clock signal end, and a second end of the first switch transistor is electrically connected to the first node.

3. The shift register according to claim 1, wherein the first control circuit comprises: a second switch transistor, a third switch transistor, a fourth switch transistor, and a fifth switch transistor, wherein
a first end of the second switch transistor is electrically connected to the first clock signal end, a control end of the second switch transistor is electrically connected to the first clock signal end, and a second end of the second switch transistor is electrically connected to the second node;
a first end of the third switch transistor is electrically connected to the first reference signal end, a control end of the third switch transistor is electrically connected to the third clock signal end, and a second end of the third switch transistor is electrically connected to the second node;
a first end of the fourth switch transistor is electrically connected to the second node, a control end of the fourth switch transistor is electrically connected to the second clock signal end, and a second end of the fourth switch transistor is connected to a first end of the fifth switch transistor; and
a control end of the fifth switch transistor is electrically connected to the first node, and a second end of the fifth switch transistor is electrically connected to the first reference signal end.

4. The shift register according to claim 1, wherein the second control circuit comprises: a first capacitor, a sixth switch transistor, and a seventh switch transistor, wherein
a first end of the first capacitor is electrically connected to the second node, and a second end of the first capacitor is electrically connected to the third node;
a first end of the sixth switch transistor is electrically connected to the fourth clock signal end, a control end of the sixth switch transistor is electrically connected to the second node, and a second end of the sixth switch transistor is electrically connected to the third node; and
a first end of the seventh switch transistor is electrically connected to the third node, a control end of the seventh switch transistor is electrically connected to the first node, and a second end of the seventh switch transistor is electrically connected to the first reference signal end.

5. The shift register according to claim 1, wherein the output circuit comprises a second capacitor, an eighth switch transistor, and a ninth switch transistor, wherein
a first end of the second capacitor is electrically connected to the third node, and a second end of the second capacitor is electrically connected to the output signal end;
a first end of the eighth switch transistor is electrically connected to the first reference signal end, a control end of the eighth switch transistor is electrically connected to the third node, and a second end of the eighth switch transistor is electrically connected to the output signal end; and
a first end of the ninth switch transistor is electrically connected to the output signal end, a control end of the ninth switch transistor is electrically connected to the first node, and a second end of the ninth switch transistor is electrically connected to the second reference signal end.

6. The shift register according to claim 1, wherein the shift register further comprises a capacitive coupling circuit, and the capacitive coupling circuit is configured to adjust the signal of the first node according to the signal of the second clock signal end.

7. The shift register according to claim 6, wherein the capacitive coupling circuit comprises a third capacitor and a tenth switch transistor, wherein
a first end of the third capacitor is electrically connected to the first node, and a second end of the third capacitor is electrically connected to a first end of the tenth switch transistor; and
a control end of the tenth switch transistor is electrically connected to the first node, and a second end of the tenth switch transistor is electrically connected to the second clock signal end.

8. A method for driving the shift register according to claim 1, comprising:
at a first stage, loading a first signal for the first clock signal end, loading a second signal for the second clock signal end, the third clock signal end, and the fourth clock signal end, and loading the second signal for the input signal end, wherein a level of the first signal is a first level, and a level of the second signal is a second level;
at a second stage, loading the first signal for the second clock signal end, loading the second signal for the first clock signal end, the third clock signal end, and the fourth clock signal end, and loading the second signal for the input signal end;
at a third stage, loading the first signal for the fourth clock signal end, loading the second signal for the first clock signal end, the second clock signal end, and the third clock signal end, and loading the first signal for the input signal end;
at a fourth stage, loading the first signal for the third clock signal end, loading the second signal for the first clock signal end, the second clock signal end, and the fourth clock signal end, and loading the first signal for the input signal end; and
at a fifth stage, loading the first signal for the first clock signal end, loading the second signal for the second clock signal end, the third clock signal end, and the fourth clock signal end, and loading the first signal for the input signal end.

9. A driving circuit, comprising cascaded a plurality of shift registers, wherein each of the plurality of shift registers comprises:

an input circuit, configured to provide a signal of an input signal end for a first node under control of a signal of a first clock signal end;

a first control circuit, configured to control a signal of a second node according to the signal of the first clock signal end, a signal of a second clock signal end, a signal of a third clock signal end, and a signal of the first node;

a second control circuit, configured to provide a signal of a fourth clock signal end for a third node under control of the signal of the second node, and provide a signal of a first reference signal end for the third node under control of the signal of the first node; and an output circuit, configured to provide the signal of the first reference signal end for an output signal end under control of a signal of the third node, and provide a signal of a second reference signal end for the output signal end under control of the signal of the first node.

10. The driving circuit according to claim 9, wherein the input circuit comprises a first switch transistor, a first end of the first switch transistor is electrically connected to the input signal end, and a control end of the first switch transistor is electrically connected to the first clock signal end, and a second end of the first switch transistor is electrically connected to the first node.

11. The driving circuit according to claim 9, wherein the first control circuit comprises: a second switch transistor, a third switch transistor, a fourth switch transistor, and a fifth switch transistor, wherein a first end of the second switch transistor is electrically connected to the first clock signal end, a control end of the second switch transistor is electrically connected to the first clock signal end, and a second end of the second switch transistor is electrically connected to the second node;

a first end of the third switch transistor is electrically connected to the first reference signal end, a control end of the third switch transistor is electrically connected to the third clock signal end, and a second end of the third switch transistor is electrically connected to the second node;

a first end of the fourth switch transistor is electrically connected to the second node, a control end of the fourth switch transistor is electrically connected to the second clock signal end, and a second end of the fourth switch transistor is connected to a first end of the fifth switch transistor; and a control end of the fifth switch transistor is electrically connected to the first node, and a second end of the fifth switch transistor is electrically connected to the first reference signal end.

12. The driving circuit according to claim 9, wherein the second control circuit comprises: a first capacitor, a sixth switch transistor, and a seventh switch transistor, wherein a first end of the first capacitor is electrically connected to the second node, and a second end of the first capacitor is electrically connected to the third node;

a first end of the sixth switch transistor is electrically connected to the fourth clock signal end, a control end of the sixth switch transistor is electrically connected to the second node, and a second end of the sixth switch transistor is electrically connected to the third node; and a first end of the seventh switch transistor is electrically connected to the third node, a control end of the seventh switch transistor is electrically connected to the first node, and a second end of the seventh switch transistor is electrically connected to the first reference signal end.

13. The driving circuit according to claim 9, wherein the output circuit comprises a second capacitor, an eighth switch transistor, and a ninth switch transistor, wherein a first end of the second capacitor is electrically connected to the third node, and a second end of the second capacitor is electrically connected to the output signal end;

a first end of the eighth switch transistor is electrically connected to the first reference signal end, a control end of the eighth switch transistor is electrically connected to the third node, and a second end of the eighth switch transistor is electrically connected to the output signal end; and a first end of the ninth switch transistor is electrically connected to the output signal end, a control end of the ninth switch transistor is electrically connected to the first node, and a second end of the ninth switch transistor is electrically connected to the second reference signal end.

14. The driving circuit according to claim 9, wherein the each of the plurality of shift registers further comprises a capacitive coupling circuit, and the capacitive coupling circuit is configured to adjust the signal of the first node according to the signal of the second clock signal end.

15. The driving circuit according to claim 14, wherein the capacitive coupling circuit comprises a third capacitor and a tenth switch transistor, wherein a first end of the third capacitor is electrically connected to the first node, and a second end of the third capacitor is electrically connected to a first end of the tenth switch transistor; and a control end of the tenth switch transistor is electrically connected to the first node, and a second end of the tenth switch transistor is electrically connected to the second clock signal end.

16. A display device, comprising a driving circuit, wherein the driving circuit comprises cascaded a plurality of shift registers, and each of the plurality of shift registers comprises:

an input circuit, configured to provide a signal of an input signal end for a first node under control of a signal of a first clock signal end;

a first control circuit, configured to control a signal of a second node according to the signal of the first clock signal end, a signal of a second clock signal end, a signal of a third clock signal end, and a signal of the first node;

a second control circuit, configured to provide a signal of a fourth clock signal end for a third node under control of the signal of the second node, and provide a signal of a first reference signal end for the third node under control of the signal of the first node; and an output circuit, configured to provide the signal of the first reference signal end for an output signal end under control of a signal of the third node, and provide a signal of a second reference signal end for the output signal end under control of the signal of the first node.

* * * * *